(12) United States Patent
Mita et al.

(10) Patent No.: US 8,083,372 B2
(45) Date of Patent: Dec. 27, 2011

(54) ILLUMINATION SYSTEM, ELECTRO-OPTIC DEVICE, AND ELECTRONIC APPARATUS

(75) Inventors: Junya Mita, Tottori (JP); Yoshinori Momose, Matsumoto (JP); Akemi Maruyama, Azumino (JP); Shintaro Hama, Tottori (JP)

(73) Assignee: Epson Imaging Devices Corporation, Nagano (JP)

( * ) Notice: Subject to any disclaimer, the term of this patent is extended or adjusted under 35 U.S.C. 154(b) by 76 days.

(21) Appl. No.: 12/425,467

(22) Filed: Apr. 17, 2009

(65) Prior Publication Data

US 2009/0268434 A1    Oct. 29, 2009

(30) Foreign Application Priority Data

Apr. 25, 2008   (JP) ................................. 2008-114908
Jun. 6, 2008    (JP) ................................. 2008-148922

(51) Int. Cl.
*F21V 21/00*   (2006.01)

(52) U.S. Cl. ............... 362/249.01; 362/249.02; 362/544
(58) Field of Classification Search .......... 362/543–545, 362/555, 561, 97.1, 67.2, 97.3, 97.4, 227, 362/230, 231, 236, 240, 241, 244, 245, 246, 362/249.01, 249.02, 249.11, 294, 326, 327, 362/329, 373, 800, 806, 812; 349/57, 58, 349/59, 61, 62, 64; 40/541, 542, 550–552, 40/563, 564

See application file for complete search history.

(56) References Cited

U.S. PATENT DOCUMENTS

| | | | | |
|---|---|---|---|---|
| 4,558,397 A | * | 12/1985 | Olsson | 361/772 |
| 5,151,771 A | * | 9/1992 | Hiroi et al. | 257/666 |
| 6,428,189 B1 | * | 8/2002 | Hochstein | 362/373 |
| 6,713,956 B2 | * | 3/2004 | Hsing Chen et al. | 313/512 |
| 7,030,423 B2 | * | 4/2006 | Chang et al. | 257/98 |
| 7,175,329 B1 | * | 2/2007 | Chou | 362/612 |
| 7,360,923 B2 | * | 4/2008 | Weber-Rabsilber et al. | 362/241 |
| 7,531,848 B2 | * | 5/2009 | Shin | 257/100 |
| 7,677,899 B2 | * | 3/2010 | Low | 439/56 |
| 2009/0097249 A1 | * | 4/2009 | Lee et al. | 362/249.02 |
| 2009/0116252 A1 | * | 5/2009 | Kille et al. | 362/373 |

FOREIGN PATENT DOCUMENTS

| | | | |
|---|---|---|---|
| CN | 1153879 A | | 7/1997 |
| CN | 2859211 Y | | 1/2007 |
| CN | 1909028 A | | 2/2007 |
| CN | 200982574 Y | | 11/2007 |
| CN | 201028340 Y | | 2/2008 |
| CN | 201047894 Y | | 4/2008 |
| JP | 05021659 A | * | 1/1993 |
| JP | 08242020 A | * | 9/1996 |
| JP | 11163705 A | * | 6/1999 |
| JP | 2006-133708 | | 5/2006 |
| JP | 2006-301209 | | 11/2006 |
| JP | 2007-073295 | | 3/2007 |
| JP | 2007-080798 | | 3/2007 |

* cited by examiner

*Primary Examiner* — Hargobind S Sawhney
(74) *Attorney, Agent, or Firm* — Lowe Hauptman Ham & Berner, LLP

(57) ABSTRACT

An illumination system includes a light source unit including a light source and a circuit substrate electrically connected to the light source. The light source is placed in the circuit substrate such that at least part of the light source overlaps the circuit substrate in the thicknesswise direction of the circuit substrate.

20 Claims, 12 Drawing Sheets

ILLUMINATION SYSTEM, ELECTRO-OPTIC DEVICE, AND ELECTRONIC APPARATUS

RELATED APPLICATIONS

The present application is based on, and claims priority from, Japanese Application Numbers 2008-114908, filed Apr. 25, 2008 and 2008-148922, filed Jun. 6, 2008, the disclosures of which are hereby incorporated by reference herein in their entireties.

BACKGROUND

1. Technical Field

The present invention relates to the structure of an illumination system suitably used in an electro-optic device.

2. Related Art

In current electronic apparatuses, such as a mobile phone, a personal digital assistant, and a computer display, liquid crystal display devices are in widespread use as an electro-optic device for displaying a video image.

In such a liquid crystal display device, a backlight system (illumination system) is provided adjacent to the rear surface of a liquid crystal display panel so that the rear surface of the liquid crystal display panel is illuminated to perform transmissive display. Such illumination systems are classified broadly into two types, i.e., the direct-lighting type and the edge-lighting type depending on the position of a light source relative to the liquid crystal display panel.

In an illumination system of the direct-lighting type, a light source is located adjacent to the rear surface of a liquid crystal display panel. On the other hand, in an illumination system of the edge-lighting type, a light guide plate guiding light is placed adjacent to the rear surface of a liquid crystal display panel and a light source is located adjacent to a side surface of the light guide plate. The direct-lighting illumination systems do not need a light guide plate as distinct from the edge-lighting illumination systems. Accordingly, the direct-lighting illumination systems have an advantage in that the cost is reduced as much as a light guide plate. Direct-lighting backlight systems are disclosed in, for example, JP-A-2006-133708, JP-A-2006-301209, JP-A-2007-73295, and JP-A-2007-80798.

The direct-lighting backlight systems disclosed in JP-A-2006-133708, JP-A-2006-301209, JP-A-2007-73295, and JP-A-2007-80798 each include a substrate and a plurality of light emitting diode elements mounted on the substrate. In these backlight systems, the thickness of a light source unit including the substrate and the light emitting diode elements is equal to the sum of the thickness of the substrate and the height of the light emitting diode element.

Accordingly, in each of the above-described backlight systems, the thickness of the light source unit is large. It is therefore necessary to provide a space capable of receiving the light source unit. Disadvantageously, it is difficult to reduce the thickness of the backlight system.

A typical direct-lighting type backlight has a structure in which a light source unit is placed in a chassis made of resin or metal. When the luminance of light sources is increased, the amount of heat generated from each light source is also increased, thus increasing a temperature in the chassis. This causes a phenomenon in which the light emission efficiency of the light source is reduced.

In particular, in the use of LEDs as light sources, the number of light sources necessary for increasing the luminance is increased. Thus, the amount of heat generated is also increased. It is therefore necessary to devise a mechanism for cooling the LEDs or restrict the amount of current flowing into the LEDs.

SUMMARY

An advantage of some aspects of the invention is to provide a direct-lighting type illumination system including a miniaturized low-profile light source unit, an electro-optic device including the illumination system, and an electronic apparatus including the electro-optic device, and to provide a direct-lighting type illumination system capable of efficiently dissipating heat generated from a light source, an electro-optic device including the illumination system, and an electronic apparatus including the electro-optic device.

According to an aspect of the invention, an illumination system includes a light source unit including a light source and a circuit substrate electrically connected to the light source. The light source is placed in the circuit substrate such that at least part of the light source overlaps the circuit substrate in the thicknesswise direction of the circuit substrate.

The above-described illumination system includes a light source unit including a light source and a circuit substrate. The light source includes, for example, a light emitting diode (LED) emitting light of at least one of red, blue, green, and white colors. The circuit substrate is a substrate provided with a circuit for supplying power to the light source and includes, for example, a printed circuit board. In a preferred example, at least one light source is provided for the circuit substrate.

In the light source unit, the light source is placed in the circuit substrate such that at least part of the light source overlaps the circuit substrate in the thicknesswise direction. Accordingly, the thickness of the light source unit (the length thereof in the direction in which light emitted from the light source travels) can be reduced as compared with a light source unit (comparative example) in which a light source is placed on a circuit substrate. Consequently, the light source unit can be reduced in thickness, thus contributing to a reduction in thickness of the illumination system.

The positive terminal (anode) and the negative terminal (cathode) of the light source may be electrically connected to positive and negative lines provided for the circuit substrate via jumper wires. Alternatively, the terminals may be electrically connected to the lines by wire bonding. A method of electrically connecting the positive and negative terminals of the light source to the positive and negative lines provided for the circuit substrate may be appropriately selected from series connection, parallel connection, and series-parallel connection depending on power supply balance and luminance balance in the illumination system.

Preferably, at least part of the light source is placed inside the circuit substrate.

In this case, at least part of the light source overlaps the inside of the circuit substrate. Accordingly, the thickness of the light source unit (the length thereof in the direction in which light emitted from the light source travels) can be reduced as compared with the comparative example. Consequently, the light source unit can be reduced in thickness, thus contributing to a reduction in thickness of the illumination system.

Preferably, the circuit substrate has a through-hole and at least part of the light source is received in the though-hole. Accordingly, at least part of the light source overlaps the inside of the circuit substrate. Consequently, the thickness of the light source unit can be reduced as compared with the comparative example.

Preferably, the light source is fixed to the circuit substrate such that the light emission surface of the light source extending through the through-hole is exposed at one surface of the circuit substrate and the bottom of the light source opposite to the light emission surface is exposed at the bottom of the through-hole in the other surface of the circuit substrate.

Since the bottom of the light source is exposed at the rear surface of the circuit substrate as described above, outside air or a member having a cooling effect can be applied to the rear surface of the circuit substrate. Thus, the effect of dissipating heat generated from the light source can be increased.

In addition, since the light source is attached to the circuit substrate such that the light source extends through the through-hole, the thickness of the light source unit can be reduced, thus achieving a reduction in thickness of the illumination system.

Furthermore, since the bottom of the light source is exposed at the rear surface of the circuit substrate, terminals of the light source can be connected to terminals provided for the substrate on the rear surface of the circuit substrate. Consequently, the front surface of the circuit substrate can be flattened. When a reflective sheet reflecting light emitted from the light source is bonded to the front surface of the circuit substrate, or when the light source unit is fixed to a support, constituting a chassis, such that the front surface of the circuit substrate is in contact with the rear surface of the support, a problem does not occur.

Preferably, the circuit substrate has a notch and at least part of the light source is fitted in the notch. Accordingly, at least part of the light source overlaps the inside of the circuit substrate. Consequently, the thickness of the light source unit can be reduced as compared with the comparative example.

Preferably, the circuit substrate has a recess and at least part of the light source is received in the recess. Accordingly, at least part of the light source overlaps the inside of the circuit substrate. Consequently, the thickness of the light source unit can be reduced as compared with the comparative example.

The light source may have a pair of terminals and the circuit substrate may have another pair of terminals. The terminals of the light source may be electrically connected to the terminals of the circuit substrate through conductive members. In a preferred example, the terminals of the circuit substrate are electrically connected to the positive terminal and the negative terminal (i.e., ground) of a power supply.

Consequently, the light source can be supplied with power through the circuit substrate, so that the light source can be allowed to emit light. In a preferred example, the conductive member is made of a material having a conductive property and an adhesive property. For example, solder or an anisotropic conductive film may be used. Thus, the light source can be fixed to the circuit substrate without adhesive.

The circuit substrate may include a flexible substrate, such as a flexible printed circuit (FPC). Thus, the thickness of the light source unit can be further reduced as compared with the comparative example.

Preferably, the light source is in contact with a heat dissipating member having a heat dissipation property. Accordingly, heat generated by light emission of the light source is dissipated through the heat dissipating member. Consequently, the quality of the light source is prevented from being seriously affected by heat. The heat dissipating member may include, for example, an insulating and heat-dissipating member (having a structure for releasing heat while transforming heat into infrared radiation using a ceramic inorganic material). In this case, to further increase the effect of dissipating heat, the insulating and heat-dissipating member may be in contact with the positive and negative terminals of the light source.

Preferably, the illumination system further includes a support holding the light source unit, the support is made of a material having a heat dissipation property, and the support is in contact with a portion of the heat dissipating member facing away from the light source. Accordingly, heat transmitted from the light source to the heat dissipating member is dissipated to the outside by the support. Thus, the effect of dissipating heat generated from the light source can be further increased. As for the support, for example, an insulating and heat-dissipating member (having a structure for releasing heat while transforming heat into infrared radiation using a ceramic inorganic material) can be used. In this case, to further increase the effect of dissipating heat, the insulating and heat-dissipating member may be in contact with the positive and negative terminals of the light source.

Preferably, the illumination system further includes a chassis holding the light source unit and the chassis has a through-hole corresponding to the position of the light source.

Since the bottom of the light source and the circuit substrate are arranged outside the chassis so as to be in direct contact with outside air, the effect of dissipating heat generated from the light source can be further increased. In addition, the thickness of the light source unit can be further reduced.

Since the light source unit can be attached to the rear of the chassis, the illumination system can be easily assembled. In addition, when the light source unit is designed so as to be detachable from the chassis, the light source unit can be easily exchanged.

Preferably, the illumination system further includes a reflective member reflecting light to increase the use efficiency of light emitted from the light source, the reflective member being placed on the surface of the circuit substrate, on which the light source emits light, such that the reflective member does not overlap the light source.

According to another aspect of the invention, an electro-optic device includes an electro-optic panel including two substrates and an electro-optic layer interposed between the substrates, and the illumination system according to the above-described aspect placed on one surface of the electro-optic panel. Thus, the electro-optic device can be reduced in thickness in association with the reduction in thickness of the illumination system.

According to further another aspect of the invention, an electronic apparatus includes a display unit including the electro-optic device according to the above-described aspect. Thus, the electronic apparatus can be reduced in thickness in association with the reduction in thickness of the electro-optic device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of the invention will be described below with reference to the drawings.

First Embodiment

Structure of Liquid Crystal Display Device

The structure of a liquid crystal display device 100, serving as an electro-optic device according to a first embodiment of the invention, will now be described with reference to FIGS. 1 to 3B.

Figure 1:
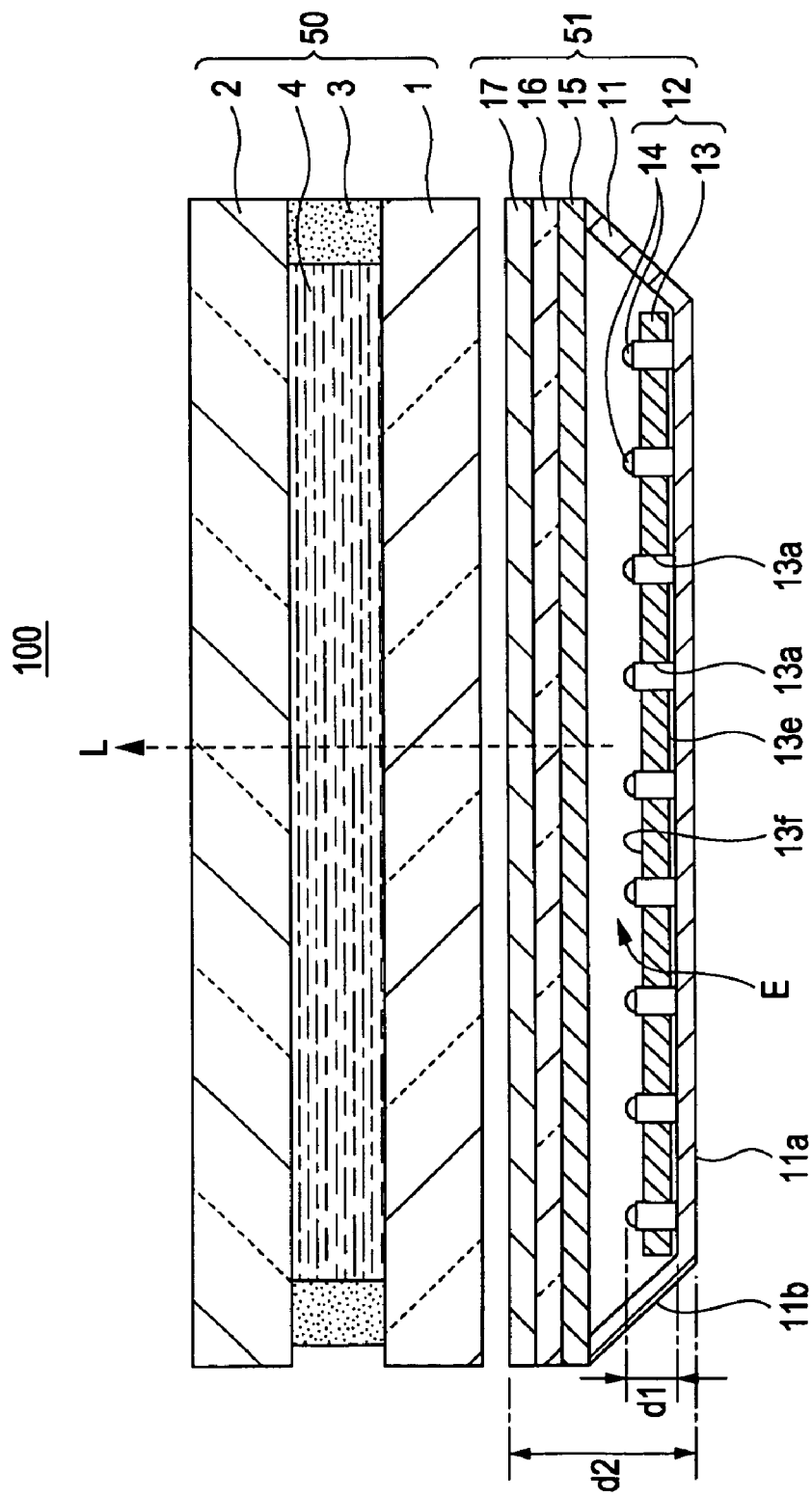
FIG. 1 is a cross-sectional view of the structure of a liquid crystal display device including an illumination system according to a first embodiment of the invention.
Figure 2:
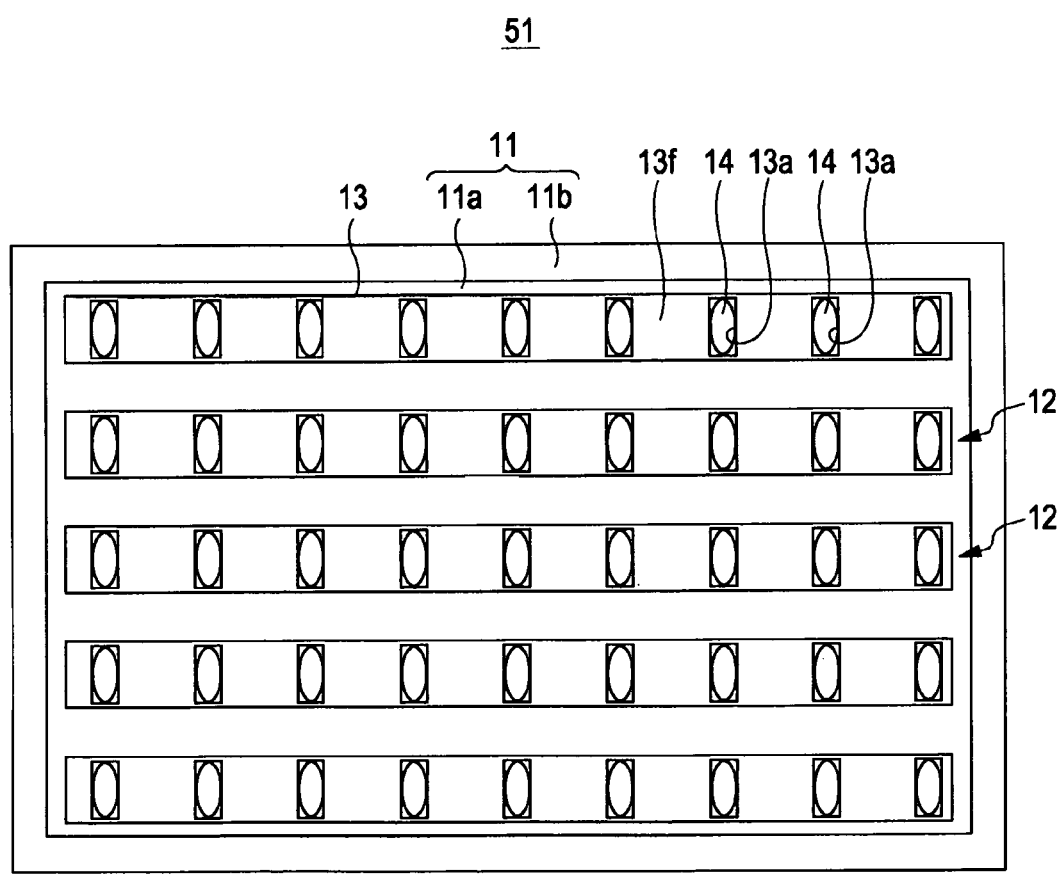
FIG. 2 is a plan view of the illumination system according to the first embodiment as viewed from the viewing side where a viewer views the liquid crystal display device.
Figure 3A:
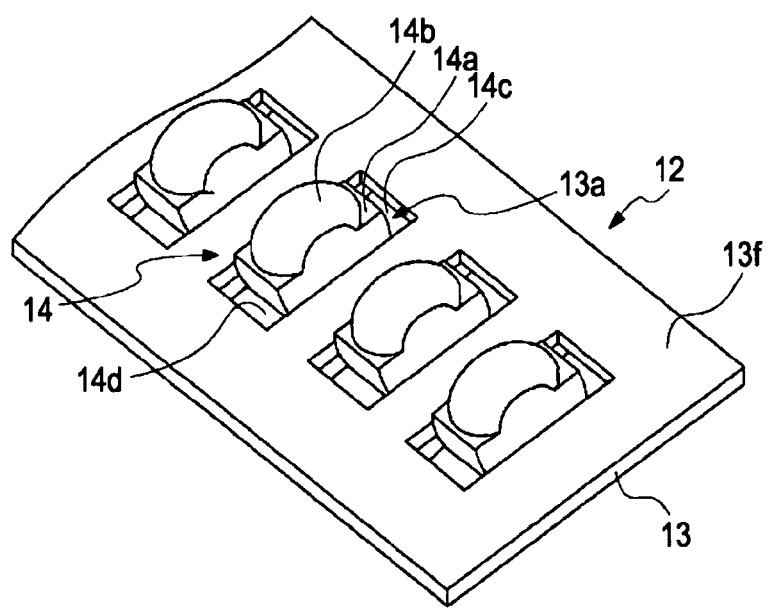
FIGS. 3A and 3B are perspective views of essential part of a light source unit in the first embodiment, FIG. 13A illustrating a mounting surface of the light source unit, FIG. 13B illustrating a non-mounting surface thereof.
Figure 3B:
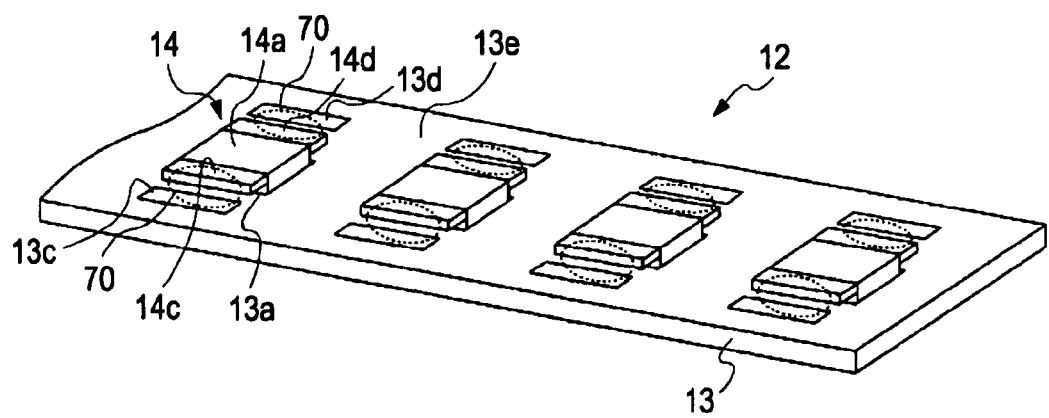

FIG. 1 is a cross-sectional view of the schematic structure of the liquid crystal display device 100 according to the first embodiment. FIG. 2 is a plan view of an illumination system 51 as viewed from the side (hereinafter, "viewing side") on which a viewer views the liquid crystal display device 100 in FIG. 1. The illumination system 51 serves as a component of the liquid crystal display device 100. In FIG. 2, various optical sheets, serving as components of the illumination system 51, are not illustrated for the sake of convenience. FIG. 3A is a perspective view of essential part of a light source unit 12 as viewed from the side (hereinafter, "light emission side") on which light emitted from light sources 14 emerges. FIG. 3B is a perspective view of essential part of the light source unit 12 as viewed from the opposite side of the light source unit 12 from that shown in FIG. 3A.

The liquid crystal display device 100 includes a liquid crystal display panel 50 and the illumination system 51 which is of the direct-lighting type for illuminating the liquid crystal display panel 50. The illumination system 51 is located on the side of the liquid crystal display panel 50 opposite from the viewing side.

The liquid crystal display panel 50 includes a first substrate 1, a second substrate 2, a frame seal 3, and a liquid crystal layer 4, serving as an example of an electro-optic layer, such that the first substrate 1 is bonded to the second substrate 2 with the frame seal 3 therebetween and the liquid crystal layer 4 is interposed in a region defined by the frame seal 3 between the two substrates. On the surface of the liquid crystal display panel 50 adjacent to the liquid crystal layer 4, for example, a black matrix, a color filter, electrodes, and other many components are arranged in a matrix (lattice) or stripe (banded) form. In FIG. 1, these components are not illustrated. A display area for image display is provided on the inside of the frame seal 3 in the liquid crystal display panel 50. In the invention, the structure of the liquid crystal display panel 50 is not limited to a specific structure. Various known structures are available.

The illumination system 51 includes a support (frame) 11 constituting a chassis, a plurality of light source units 12, and the various optical sheets.

The support 11, constituting the chassis, includes a flat portion 11a which has a rectangular planar shape and supports the light source units 12 and an extending portion 11b which obliquely extends outwardly from the periphery of the flat portion 11a toward a first diffuser 15 and supports the various optical sheets. In the invention, the shape of the support 11 is not limited.

Each light source unit 12 includes a circuit substrate 13 and the light sources 14 electrically connected to the circuit substrate 13. In this embodiment, each light source unit 12 has a belt-like planar shape as shown in FIG. 2. The light source units 12 are arranged in parallel to each other on the flat portion 11a of the support 11.

The circuit substrate 13 is a substrate provided with a circuit for supplying power to the respective light sources 14. For example, a printed circuit board can be used. The circuit substrate 13 has, for example, a rectangular planar shape. The circuit substrate 13 has a plurality of through-holes 13a, serving as insertion holes, and pairs of terminals (13c, 13d). Referring to FIG. 3B, each pair of terminals 13c and 13d are disposed near the corresponding through-hole 13a on a mounting surface 13e of the circuit substrate 13 such that the through-hole 13a is interposed between the terminals. Each terminal 13c is electrically connected to a wiring line (not shown) which is electrically connected to the positive terminal of a power supply. On the other hand, each terminal 13d is electrically connected to a wiring line which is electrically connected to the negative terminal (i.e., the ground) of the power supply. Hereinafter, the opposite surface of the circuit substrate 13 from the mounting surface 13e will be called "non-mounting surface 13f".

Each light source 14 includes a light emitting diode emitting light of, for example, at least one of red, blue, green, and white colors. Referring to FIGS. 3A and 3B, the light source 14 includes a base 14a, a light emission portion 14b, and a pair of terminals (14c, 14d). The base 14a is made of a material, such as resin, having an insulating property. The light emission portion 14b including a light emitting diode element that emits light is supported by the base 14a. The terminals 14c and 14d are electrically connected to the light emitting diode element of the light emission portion 14b. The terminal 14c is electrically connected through a conductive member 70 to the terminal 13c provided on the mounting surface 13e of the circuit substrate 13. On the other hand, the terminal 14d is electrically connected through another conductive member 70 to the terminal 13d provided on the mounting surface 13e of the circuit substrate 13. The light source 14 is fitted in the circuit substrate 13 such that at least part of the light source 14 overlaps the circuit substrate 13 in the thicknesswise direction of the substrate 13. The arrangement of the light sources 14 relative to the circuit substrate 13 will be described in detail later.

The above-described various optical sheets include the first diffuser 15 diffusing light, a prism sheet 16 condensing light, and a second diffuser 17 diffusing light. In the invention, the arrangement of the various optical sheets is not limited to a specific arrangement.

The first diffuser 15 is supported by the end of the extending portion 11b of the support 11 constituting the chassis. Accordingly, a space E is provided between the first diffuser 15 and the arrangement of the light source units 12 such that the space E has a predetermined distance therebetween. The reason why the predetermined distance is provided between the first diffuser 15 and the light source units 12 is that the first diffuser 15 easily diffuses light L emitted from each light source 14 toward the prism sheet 16. The prism sheet 16 is placed on the surface of the first diffuser 15 adjacent to the liquid crystal display panel 50. The second diffuser 17 is placed on the surface of the prism sheet 16 adjacent to the liquid crystal display panel 50. To further diffuse the light L condensed by the prism sheet 16, preferably, the second diffuser 17 has a higher optical diffusivity than that of the first diffuser 15.

In the liquid crystal display device 100 with the above-described structure, light L emitted from the light sources 14 travels along the dash line in FIG. 1. Specifically, the light L emitted from the light sources 14 travels to the first diffuser 15 and then passes through the first diffuser 15, so that the light L is diffused. The diffused light L passes through the prism sheet 16, so that the light L is condensed. The condensed light L travels to the second diffuser 17 and then passes through the second diffuser 17, so that the light L is diffused. The diffused light L is applied to the liquid crystal display panel 50. In this instance, the alignment of liquid crystal molecules in the liquid crystal layer 4 is controlled in the liquid crystal display panel 50, so that a desired display image is visually recognized by the viewer.

Structure of Light Source Unit

The structure of each light source unit 12 in the illumination system 51 in the first embodiment will now be described with reference to FIGS. 1 to 3B.

In each light source unit 12, the light sources 14 are inserted from the mounting surface 13e of the circuit substrate 13 into the through-holes 13a, serving as the insertion holes, respectively. Part of the base 14a of each light source 14 is received in the corresponding through-hole 13a. The light emission portion 14b of each light source 14 is placed on the non-mounting surface 13f and the paired terminals 14c and 14d thereof are arranged on the mounting surface 13e.

As described above, in each light source unit 12, the light sources 14 are arranged in the circuit substrate 13 such that at least part of each light source 14 overlaps the circuit substrate 13 in the thicknesswise direction of the substrate 13, alternatively, at least part of each light source 14 is located inside the circuit substrate 13. In other words, since part of each base 14a is received in the corresponding through-hole 13a in each light source unit 12, the part of the base 14a overlaps the circuit substrate 13 in the thicknesswise direction of the substrate, or overlaps the inside of the circuit substrate 13. Consequently, the thickness of each light source unit 12 is the same as the height d1 of each light source 14 as shown in FIG. 1. Thus, the thickness of the light source unit 12 (the length thereof in the traveling direction of the light L) can be reduced as compared with a light source unit (comparative example) in which light sources are arranged on a circuit substrate. Accordingly, the light source unit 12 can be reduced in thickness, thus contributing to a reduction in thickness of the illumination system 51. In addition, since the low-profile illumination system 51 can be achieved, the liquid crystal display device 100 can be reduced in thickness.

In each light source unit 12, the paired terminals (14c, 14d) of each light source 14 are electrically connected through the conductive members 70 to the paired terminals (13c, 13d) in the circuit substrate 13, the terminals 13c and 13d being electrically connected to the wiring lines connected to the positive and negative terminals of the power supply. Accordingly, the light source 14 can be supplied with power through the circuit substrate 13 so that the light source 14 is allowed to emit light. As for the conductive member 70, a material having a conductive property and an adhesive property is preferably used. For example, solder or an anisotropic conductive film is available. Thus, the light sources 14 can be fixed to the mounting surface 13e of the circuit substrate 13 without adhesive.

Second Embodiment

A liquid crystal display device 100a including an illumination system 51a according to a second embodiment of the invention will be described below with reference to FIGS. 4A and 4B.

Figure 4A:
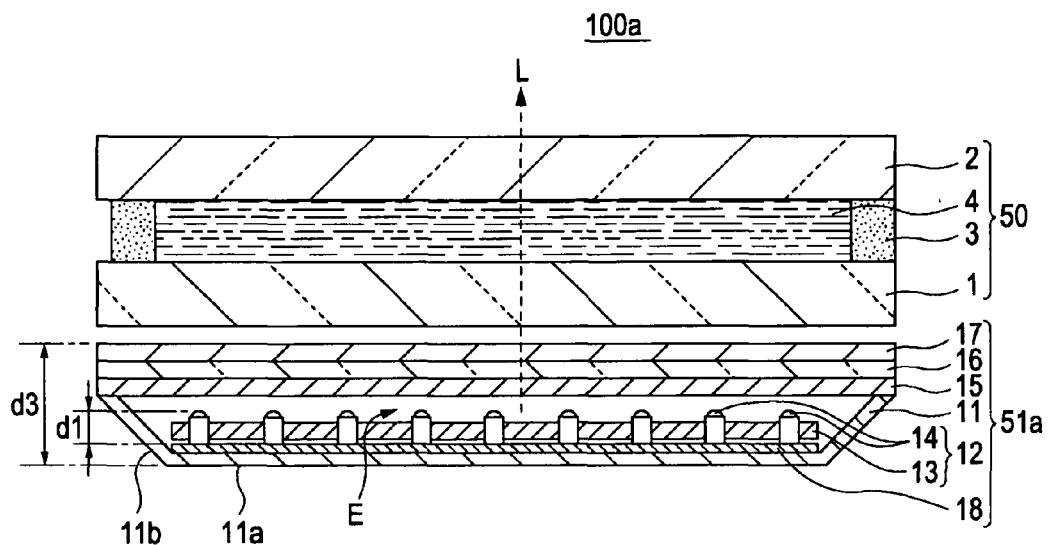
FIG. 4A is a cross-sectional view of the structure of a liquid crystal display device including an illumination system according to a second embodiment of the invention.
Figure 4B:
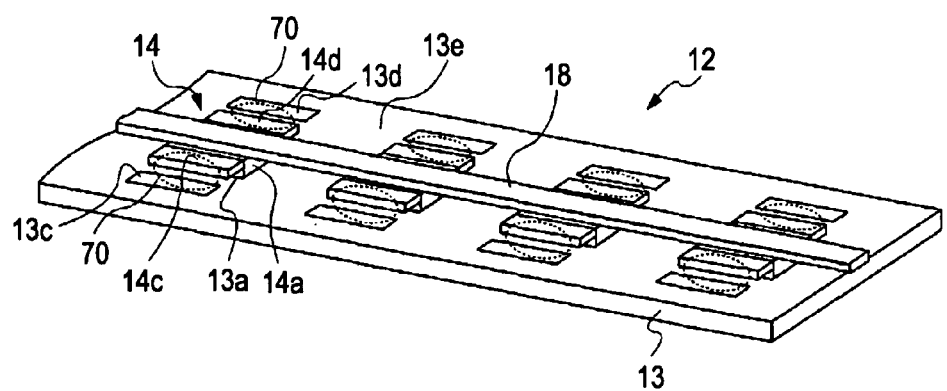
FIG. 4B is a perspective view of essential part of a light source unit of the illumination system according to the second embodiment.

FIG. 4A is a cross-sectional view of the schematic structure of the liquid crystal display device 100a including the illumination system 51a according to the second embodiment. FIG. 4B is a perspective view of essential part of the illumination system 51a and illustrates the arrangement relationship between a heat dissipating member 18 and a light source unit 12 in the second embodiment, FIG. 4B corresponding to FIG. 3B.

The second embodiment differs from the first embodiment in that the illumination system 51a is provided with the heat dissipating members for dissipating heat generated from light sources 14. Other components in the second embodiment are the same as those in the first embodiment. In the following description, therefore, the same components as those in the first embodiment are designated by the same reference numerals and explanation of the previously described components is appropriately omitted.

Specifically, the illumination system 51a includes the heat dissipating members 18 having a heat dissipation property in addition to a support 11 constituting a chassis, a plurality of light source units 12, and various optical sheets. It is preferred that each heat dissipating member 18 be made of a metallic material having a high thermal conductivity. Furthermore, to achieve the low-profile light source unit 12, it is preferred that the heat dissipating member 18 be thinned as much as possible so that the heat dissipation property is not deteriorated. The heat dissipating member 18 has a belt-like planar shape such that the member extends in the direction in which the light source unit 12 extends. The heat dissipating member 18 is interposed between the support 11, constituting the chassis, and part of the base 14a of each of the aligned light sources 14. Accordingly, at least part of the base 14a is in contact with the heat dissipating member 18, the part being located on the opposite side of each light source 14 from the light emission side on which light L is emitted and being not in contact with a pair of terminals (14c, 14d).

Consequently, heat generated by light emission of the light sources 14 is transmitted through the respective bases 14a to the heat dissipating members 18. The heat transmitted to the heat dissipating members 18 is further transmitted to the support 11 constituting the chassis and the air in a space E. In other words, heat exchange is performed between the heat dissipating members 18 and the combination of the support 11 and the air in the space E. Since heat generated from each light source 14 is dissipated, the quality of the light source 14 is prevented from being seriously affected by heat. As for the support 11 constituting the chassis, a material having a high heat dissipation property is preferably used. Accordingly, heat transmitted from the light sources 14 to the heat dissipating members 18 is released through the support 11 to the outside of the system 51a, so that the effect of dissipating heat generated from the light sources 14 can be further increased. In addition, since the heat dissipating member 18 is in contact with the light sources 14 in each light source unit 12, heat generated from the light sources 14 is dissipated in each light source unit 12. Consequently, the total effect of heat dissipation in the light source units 12 can be increased.

Since the illumination system 51a in the second embodiment includes the heat dissipating members 18, the thickness d3 of the illumination system 51a is slightly larger than the thickness d2 of the illumination system 51 in the first embodiment by an amount corresponding to the height of the heat dissipating member 18. However, when each heat dissipating member 18 is thinned as much as possible so that the heat dissipation property is not deteriorated, the light source units 12 and the illumination system 51a can be reduced in thickness.

Each heat dissipating member 18 may have a fin-like shape with an increased surface area to further enhance the heat dissipation property. In this structure, preferably, the heat dissipating member 18 is thinned as much as possible so that the heat dissipation property is not deteriorated. Accordingly, the heat dissipating member 18 can be increased in surface area by reducing the thickness of part of the heat dissipating member 18 overlapping a circuit substrate 13 and increasing the thickness of part of the heat dissipating member 18 which does not overlap the circuit substrate 13. Heat transmitted through each base 14a to the heat dissipating member 18 is transmitted to the support 11 constituting the chassis and the air in the space E. The heat dissipating member can be made of an excellent heat-dissipation silicon rubber sheet having a good thermal conductivity, a heat-radiation ceramic sheet using a ceramic coating, or a heat-conductive sheet using a phase change. The heat dissipating member made of any of these sheets may be in direct contact with the light sources 14. Alternatively, any of these sheets may be interposed between the heat dissipating member and the light sources 14. Alternatively, the heat dissipating member and a plurality of the sheets may be layered on the light sources 14.

Third Embodiment

The structure of a liquid crystal display device including an illumination system 51b according to a third embodiment of the invention will be described below with reference to FIGS. 5 to 6C.

Figure 5:
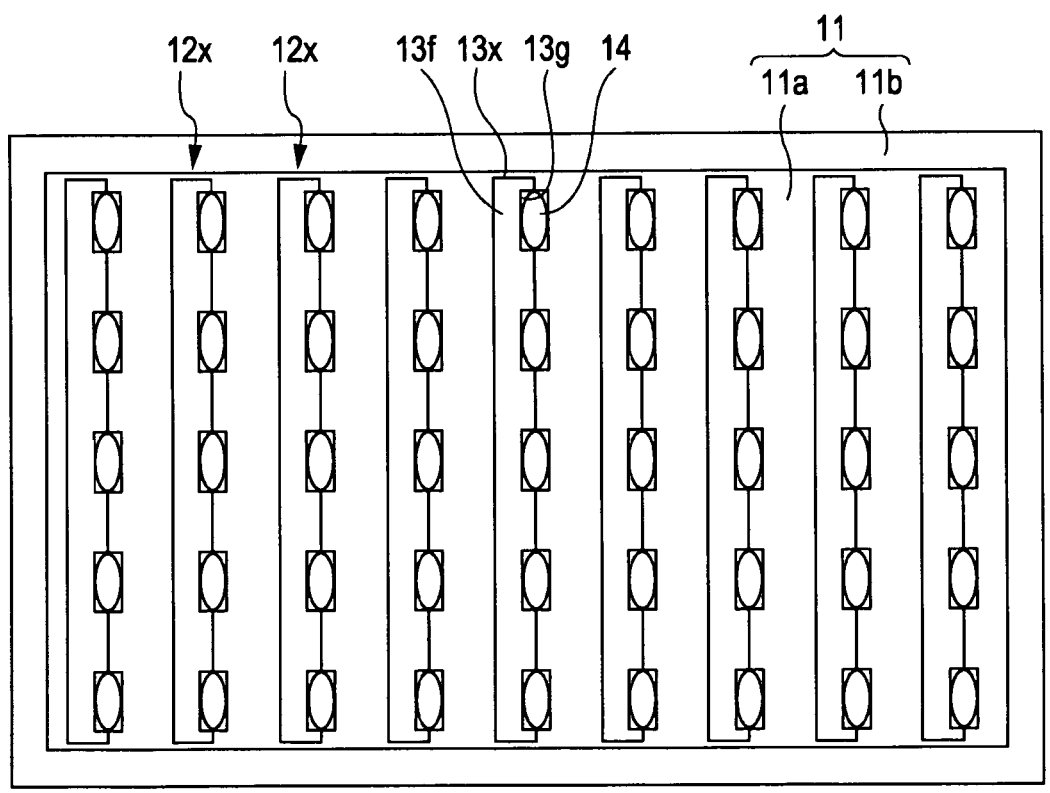
FIG. 5 is a plan view of an illumination system according to a third embodiment of the invention as viewed from the viewing side.
Figure 6A:
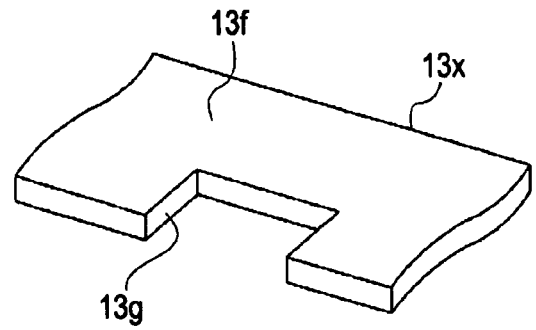
FIGS. 6A and 6B are perspective views of essential part of an illumination system according to the third embodiment.
Figure 6B:
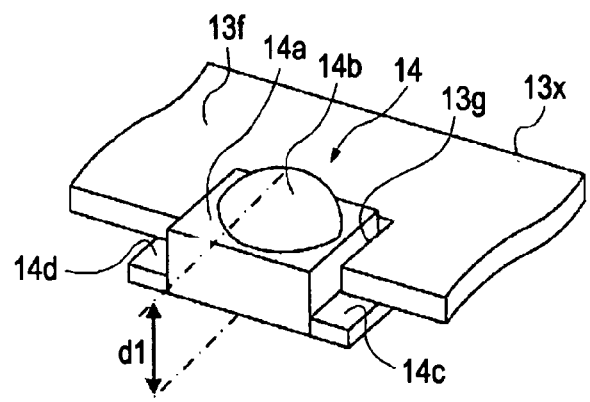

FIG. 5 is a plan view of the illumination system 51b according to the third embodiment as viewed from the viewing side. In FIG. 5, various optical sheets as components of the illumination system 51b are not illustrated for the sake of convenience. FIG. 6A is a perspective view of essential part of a circuit substrate 13x constituting a light source unit 12x in the third embodiment. FIG. 6B is a perspective view of essential part of the light source unit 12x as viewed from the light emission side of a light source 14. FIG. 6C is a plan view of essential part of the light source unit 12x as viewed from the opposite side of the light sources 14 from the light emission side.

The liquid crystal display device in the third embodiment differs from the liquid crystal display device 100 in the first embodiment with respect to only the structure of each light source unit. The other structure of the device in the third embodiment is the same as that in the first embodiment. In the following description, therefore, the same components as those in the first embodiment are designated by the same reference numerals and explanation of the previously described components is appropriately omitted.

Specifically, the illumination system 51b includes a support 11 constituting a chassis, a plurality of light source units 12x, and various optical sheets. The light source units 12x, each including the circuit substrate 13x and the light sources 14, are arranged in parallel to each other on a flat portion 11a of the support 11.

Referring to FIGS. 5 and 6A, each circuit substrate 13x is plate-shaped and has a belt-like planar shape. The circuit substrate 13x has a plurality of notches 13g obtained by cutting parts away from one end of the circuit substrate 13x. The notches 13g are arranged at regular intervals in the lengthwise direction of the circuit substrate 13x. On a mounting surface 13e of the circuit substrate 13x, a pair of terminals (13c, 13d) are arranged so as to sandwich each notch 13g. Each of the terminals 13d arranged in the lengthwise direction of the circuit substrate 13x is electrically connected to a wiring line 81 formed in a layer in the circuit substrate 13x. The wiring line 81 is indicated by a dotted line in FIG. 6C and is electrically connected the negative terminal of a power supply. On the other hand, each of the terminals 13c arranged in the lengthwise direction of the circuit substrate 13x is electrically connected to a wiring line 82 formed in a layer in the circuit substrate 13x. The wiring line 82 is indicated by an alternate long and short dash line in FIG. 6C and is electrically connected to the positive terminal of the power supply. Preferably, the wiring lines 81 and 82 are disposed in different layers in the circuit substrate 13x. In this case, the electrical connection between the wiring line 82 and each terminal 13c and that between the wiring line 81 and each terminal 13d are achieved through contact holes disposed in the circuit substrate 13x, respectively.

The light sources 14 are arranged in each circuit substrate 13x such that at least part of each light source 14 overlaps the circuit substrate 13x in the thicknesswise direction of the substrate, alternatively, at least part of the light source 14 is located inside the circuit substrate 13x. In other words, as shown in FIGS. 5 and 6B, the light sources 14 are arranged in the circuit substrate 13x such that at least part of each light source 14 (in this embodiment, part of a base 14a) is fitted in or engaged with the corresponding notch 13g in the circuit substrate 13x.

With the above-described structure, part of each base 14a overlaps the circuit substrate 13x in the thicknesswise direction of the substrate, or overlaps the inside of the circuit substrate 13x. Accordingly, the thickness of each light source unit 12x is the same as the height d1 of each light source 14. Therefore, the thickness of each light source unit 12x can be reduced as compared with the above-described comparative example. Consequently, each light source unit 12x can be reduced in thickness, thus contributing to a reduction in thickness of the illumination system 51b. Since the low-profile illumination system 51b can be achieved, the liquid crystal display device including the illumination system 51b can also be reduced in thickness.

Figure 6C:
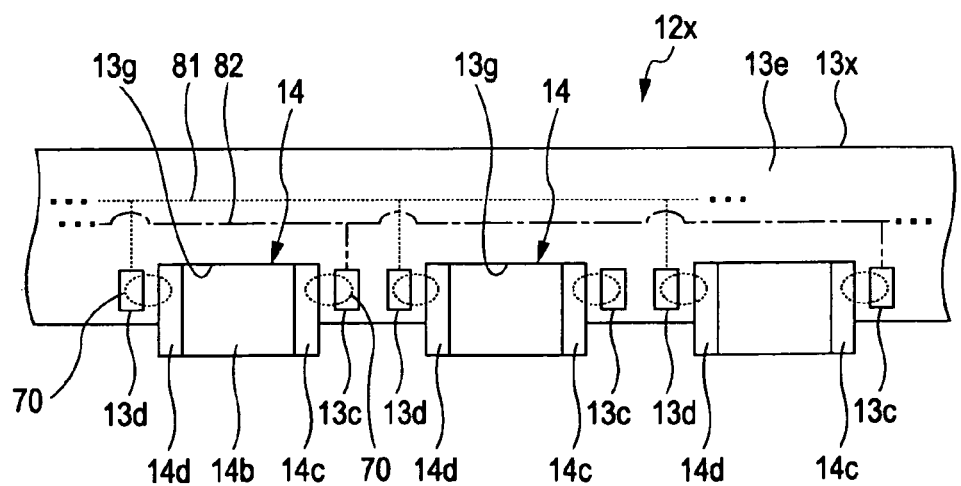
FIG. 6C is a plan view of essential part of the illumination system according to the third embodiment.

As shown in FIG. 6C, a pair of terminals (14c, 14d) of each light source 14 are located on the mounting surface 13e of the circuit substrate 13x. The terminals (14c, 14d) of the light source 14 are electrically connected through conductive members 70 to the paired terminals (13c, 13d) of the circuit substrate 13x which are electrically connected to the wiring lines connected to the positive and negative terminals of the power supply. Accordingly, the light source 14 can be supplied with power through the circuit substrate 13x so that the light source 14 is allowed to emit light. When a material having a conductive property and an adhesive property is used as the conductive member 70, the light source 14 can be fixed to the mounting surface 13e of the circuit substrate 13x without adhesive.

A heat dissipating member for increasing the effect of dissipating heat generated from the light sources 14 may be provided in each light source unit 12x. In this case, the heat dissipating member (not illustrated) having, for example, a comb-teeth-like planar shape is provided such that each comb-teeth segment is in contact with part of the base 14a on the opposite side of the light source 14 from the light emission side. Thus, heat generated from the light source 14 is dissipated, so that the quality of the light source 14 is prevented from being seriously affected by heat.

Fourth Embodiment

The structure of a liquid crystal display device including an illumination system 51c according to a fourth embodiment of the invention will be described with reference to FIGS. 7A and 7B.

Figure 7A:
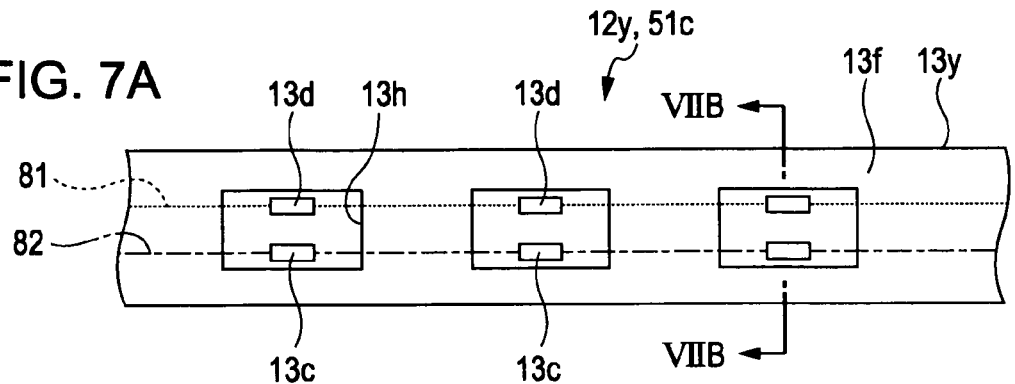
FIG. 7A is a plan view of essential part of an illumination system according to a fourth embodiment of the invention.

FIG. 7A is a plan view of essential part of a circuit substrate 13y in the fourth embodiment as viewed from the side adjacent to a non-mounting surface 13f. FIG. 7B is a cross-sectional view of essential part of a light source unit 12y in the fourth embodiment taken along the line VIIB-VIIB in FIG. 7A.

The liquid crystal display device in the fourth embodiment differs from the liquid crystal display device 100 in the first embodiment with respect to only the structure of each light source unit. The liquid crystal display device in the fourth embodiment has the same structure as that in the first embodiment except for the structure of each light source unit. Accordingly, the same components as those in the first embodiment are designated by the same reference numerals and explanation of the previously described components is appropriately omitted.

Specifically, the illumination system 51c includes a support 11 constituting a chassis, the light source units 12y, and various optical sheets. The light source units 12y, each including the circuit substrate 13y and a plurality of light sources 14y, are arranged in parallel to each other on a flat portion 11a of the support 11.

Referring to FIG. 7A, the circuit substrate 13y is plate-shaped and has a belt-like planar shape. As shown in FIGS. 7A and 7b, the circuit substrate 13y has a plurality of recesses 13h and paired terminals (13c, 13d) such that each recess 13h receives one pair of terminals. The recesses 13h are arranged on the non-mounting surface 13f of the circuit substrate 13y at regular intervals in the lengthwise direction of the circuit substrate 13y. Each of the terminals 13d arranged in the lengthwise direction of the circuit substrate 13y is electrically connected to a wiring line 81 formed in a layer in the circuit substrate 13y. The wiring line 81 is indicated by a dotted line in FIG. 7A and is electrically connected the negative terminal of a power supply. On the other hand, each of the terminals 13c arranged in the lengthwise direction of the circuit substrate 13y is electrically connected to a wiring line 82 formed in a layer in the circuit substrate 13y. The wiring line 82 is indicated by an alternate long and short dash line in FIG. 7A and is electrically connected to the positive terminal of the power supply.

Each light source 14y fundamentally has the same structure as that of the above-described light source 14. The light source 14y differs from the light source 14 in that paired terminals (14c, 14d) are disposed on a surface of a base 14a facing away from a light emission portion 14b. The light sources 14y are arranged in the circuit substrate 13y such that at least part of each light source 14y overlaps the circuit substrate 13y in the thicknesswise direction of the substrate, alternatively, at least part thereof is located inside the circuit substrate 13y. In other words, the light sources 14y are disposed in the circuit substrate 13y such that at least par of each light source 14y (in this embodiment, part of the base 14a and the paired terminals 14c and 14d) is located in the recess 13h of the circuit substrate 13y.

Accordingly, in each light source unit 12y, part of each base 14a overlaps the circuit substrate 13y in the thicknesswise direction of the substrate, or overlaps the inside of the circuit substrate 13y. Therefore, the thickness of the light source unit 12y can be reduced as compared with the comparative example. Consequently, the light source unit 12y can be reduced in thickness, thus contributing to a reduction in thickness of the illumination system 51c. Since the low-profile illumination system 51c can be achieved, the liquid crystal display device including the illumination system 51b can also be reduced in thickness.

In this embodiment, a heat dissipating member 18 for increasing the effect of dissipating heat generated from the light sources 14y may be provided in each light source unit 12y. FIG. 7C is a cross-sectional view of essential part of the light source unit 12y including the heat dissipating member.

In this case, the circuit substrate 13y has openings 13k, each of which extends from a mounting surface 13e through the circuit substrate 13y to the base 14a of the corresponding light source 14y. Each heat dissipating member 18 is placed so as to be in contact with at least part of the mounting surface 13e of the circuit substrate 13y. Parts of the heat dissipating member 18 are located in the openings 13k such that each part is in contact with at least part of the base 14a of the corresponding light source 14y.

Accordingly, heat generated from the light sources 14 is dissipated through the heat dissipating member 18 on the basis of the same principle as that in the second embodiment. The quality of each light source 14y is prevented from being seriously affected by heat. Preferably, the support 11 is made of a material having an excellent heat dissipation property. Consequently, heat transmitted from the light sources 14y to the heat dissipating member 18 is released to the outside of the device through the support 11, so that the effect of dissipating heat generated from the light sources 14y can be further increased.

Modifications

The invention is not limited to the structures of the illumination systems according to the first to fourth embodiments. Various modifications can be made without departing from the spirit and scope of the invention.

For example, it is preferred that the thickness of each light source be reduced as much as possible on the condition that the circuit substrate (13, 13x, 13y) does not hinder the light source (14, 14x, 14y) from emitting light, irrespective of the relationship between the height of the light source (14, 14x, 14y) and the thickness of the circuit substrate (13, 13x, 13y). Consequently, each light source unit can be further reduced in thickness.

Figure 7B:
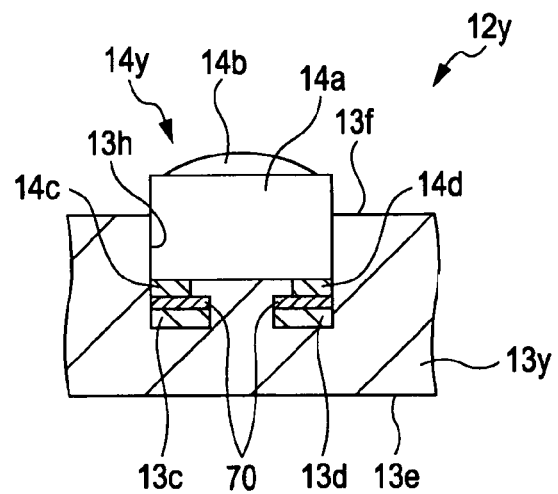
FIG. 7B is a cross-sectional view of essential part of the illumination system according to the fourth embodiment.
Figure 7C:
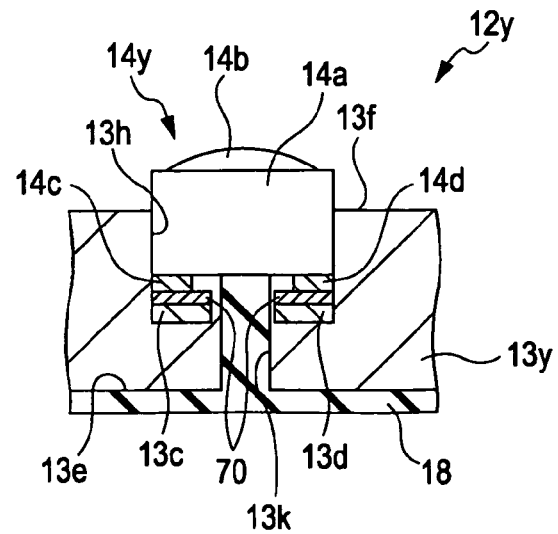
FIG. 7C is a cross-sectional view of essential part of an illumination system according to a modification of the fourth embodiment.
Figure 8A:
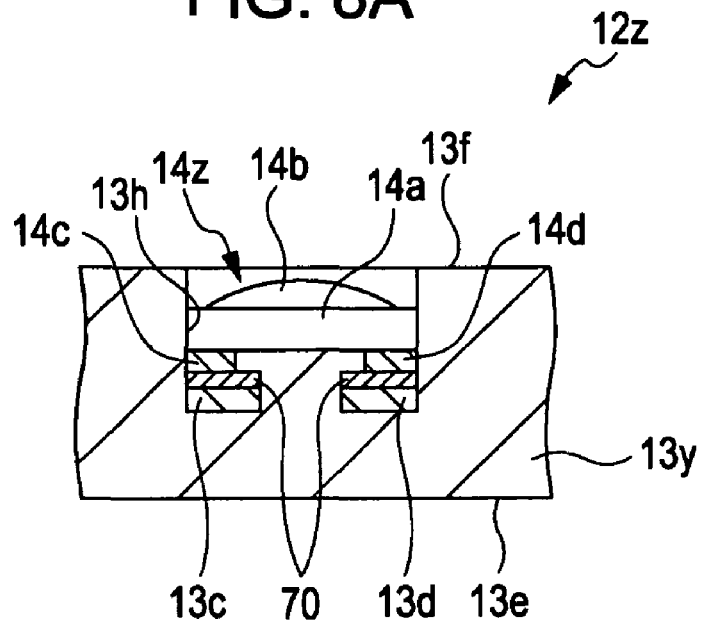
FIGS. 8A and 8B are cross-sectional views of essential parts of illumination systems according to modifications.
Figure 8B:
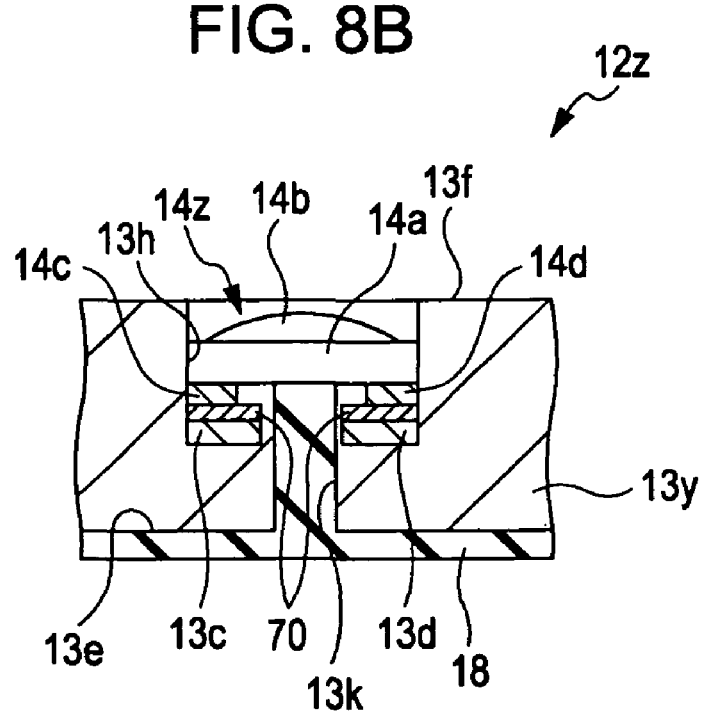

FIG. 8A is a cross-sectional view of essential part of a light source unit 12z and corresponds to FIG. 7B. FIG. 8A illustrates a case where a light source 14z in accordance with the above-described modification is applied to the light source unit 12y. FIG. 8B is a cross-sectional view of essential part of the light source unit 12z and corresponds to FIG. 7C. FIG. 8B illustrates a case where the light source 14z in the modification is applied to the light source unit 12y.

Referring to FIGS. 8A and 8B, the thickness of each light source 14z is smaller than that of the light source 14y. The light sources 14z are disposed in the circuit substrate 13y such that the whole of each light source 14z is covered by the circuit substrate 13y in the thickness direction of the substrate, or is located inside the circuit substrate 13y.

Accordingly, each light source 14z is recessed lower than the non-mounting surface 13f of the circuit substrate 13y, namely, the light source 14z is close to the mounting surface 13e. With this structure, the thickness of each light source unit 12z including the light sources 14z is the same as that of the circuit substrate 13y. In other words, the light sources 14z can be incorporated in the circuit substrate 13y. In this arrangement, the various optical sheets, for example, the first diffuser 15 can be in contact with the circuit substrate 13y. Thus, the lower-profile illumination system can be obtained.

To increase the use efficiency of the light L emitted from the light source (14, 14x, 14y, 14z), it is preferred that a reflective material (e.g., aluminum or silver) reflecting light be placed on the non-mounting surface 13f of the circuit substrate (13, 13x, 13y) so as not to overlap the light sources (14, 14x, 14y, 14z).

The numbers of light sources (14, 14x, 14y, 14z), the shape of each light source, and the kind of color of emitted light are not limited. In addition, the shape of the circuit substrate (13, 13x, 13y) and that of the heat dissipating member 18 are not limited.

In the illumination system according to any of the embodiments and modifications of the invention, a light guide plate, made of a transparent material, for guiding light L emitted from the light sources (14, 14x, 14y, 14z) to the liquid crystal display panel 50 may be provided as an optical member.

Any of the circuit substrates in the above-described embodiments and modifications can be a flexible substrate, such as a flexible printed circuit (FPC). Accordingly, the thickness of any of the light source units in the embodiments and modifications can be further reduced as compared with the comparative example. In the case where an FPC is used as any of the above-described circuit substrates, the circuit substrate is supported by the support 11 constituting the chassis, thus increasing the strength of the circuit substrate. In other words, the combination of the support and the circuit substrate can increase the strength of the circuit substrate.

In the invention, the display device, as an example of the electro-optic device, is not limited to the liquid crystal display device. The invention is applicable to an organic electroluminescent display device, a plasma display device, and a field emission display device.

Fifth Embodiment

The structure of a liquid crystal display device including an illumination system 51 according to a fifth embodiment of the invention will be described with reference to FIGS. 9A and 9B.

Figure 9A:
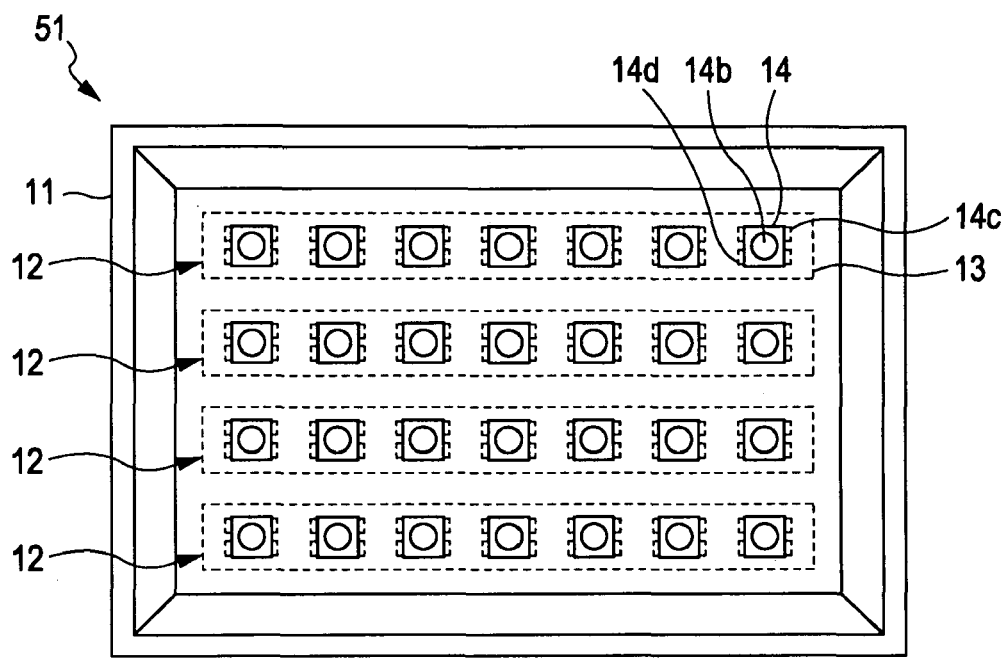
FIG. 9A is a plan view of an illumination system according to a fifth embodiment of the invention as viewed from the viewing side.
Figure 9B:
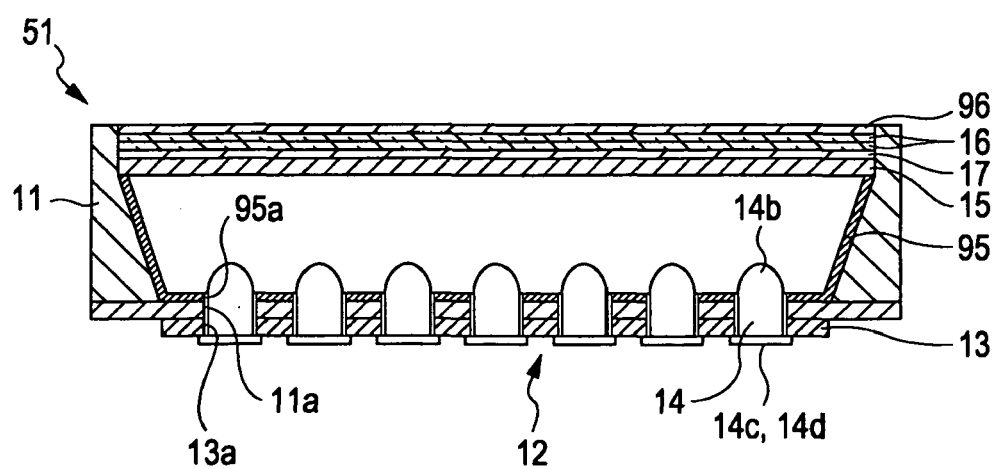
FIG. 9B is a cross-sectional view of the illumination system according to the fifth embodiment.

FIGS. 9A and 9B illustrate the structure of the illumination system 51. FIG. 9A is a diagram illustrating the inside of a support 11 constituting a chassis. FIG. 9B is a cross-sectional view of the illumination system 51.

Referring to FIGS. 9A and 9B, the illumination system 51 includes the support 11, which is made of resin or a metallic plate and is shaped in a box-like frame having an upper open end and serves as the chassis supporting light source units 12. The support 11 constituting the chassis is overlaid in series with a first diffuser 15, a diffusing sheet 17, lens sheets (two prism sheets) 16, and a reflective polarizing sheet 96. In addition, a white reflective sheet 95 is bonded to the inner wall of the support 11 constituting the chassis.

Each light source unit 12 includes a plurality of light emitting diodes (LEDs), serving as light sources 14, and a circuit substrate (FPC or PWB) 13 on which LED chips as the light sources 14 are mounted by soldering. The circuit substrate 13 has a strip (belt-like) shape having long sides in the direction in which the light sources 14 are aligned. Four circuit substrates 13 are aligned in parallel to one another on the rear surface of the support 11 constituting the chassis such that the long sides of each circuit substrate 13 extend in the lengthwise direction of the illumination system 51.

The light sources 14 include three kinds of LEDs emitting light of three colors, e.g., red (R), green (G), and blue (B). Each light source 14 includes a light emission portion 14b emitting light and two terminals 14c and 14d for connection to the circuit substrate 13, the terminals corresponding to the bottom of the light source 14 opposite from the light emission portion 14b. In this case, the three colors of R, G, and B are mixed into white. The light sources 14 do not necessarily include LEDs of different colors. The light sources 14 may include white (pseudo white) LEDs.

Each circuit substrate 13 has a plurality of through-holes 13a, serving as insertion holes, through which the light emission portions 14b of the light sources 14 are inserted. The through-holes 13a correspond to the mounting positions of the respective light sources 14. The light emission portion 14b of each light source 14 protrudes (upwardly in FIG. 9B) from the front surface of the circuit substrate 13 (one principle surface thereof facing the support 11 constituting the chassis). The light source 14 is inserted from the rear surface of the circuit substrate 13 (the other principle surface thereof facing away from the support 11 constituting the chassis), namely, from below in FIG. 9B. The terminals 14c and 14d of the light source 14 are connected to terminals (not illustrated) disposed on the rear surface of the circuit substrate 13 (the other principle surface thereof facing away from the support 11 constituting the chassis). Thus, mounting the light source 14 is achieved.

In other words, the light sources 14 are mounted on each circuit substrate 13 such that the terminals 14c and 14d of the light sources 14 protrude from the rear surface of the circuit substrate 13, namely, the terminals 14c and 14d are exposed at the rear surface thereof.

As will be understood from the above-described structure, each light source 14 is received in the corresponding through-hole 13a, serving as the insertion hole, in the circuit substrate 13 so that the thickness of the circuit substrate 13 is included in the distance (height) from the surface of the terminal (14c, 14d) of each light source 14 to the surface of the light emission portion 14b (the exposed surface of the light source facing the diffuser).

The support 11, constituting the chassis, has a plurality of though-holes 11c, serving as insertion holes, in the bottom such that the through-holes 11c are located in respective positions corresponding to the light sources 14. The white reflective sheet 95 also has a plurality of through-holes 95a in respective positions corresponding to the light sources 14. The light sources 14 mounted on each circuit substrate 13 are inserted from the rear surfaces of the support 11 and the white reflective sheet 95 through the through-holes 11a and 95a, respectively. The circuit substrates 13 are fixed to the support 11 while the front surface of each circuit substrate 13 is come into contact with the rear surface of the support 11 constituting the chassis, so that the light source units 12 are arranged in the support 11.

As will be understood from the above-described structure, the thickness of the bottom of the support 11, constituting the chassis, and that of the white reflective sheet 95 overlying the support 11 are included in the distance (height) from the surface of each circuit substrate 13 (one principle surface thereof facing the support 11) to the top of the light emission portion 14b of each light source 14. The light emission portions 14b of the light sources 14 protrude from the front surface of the white reflective sheet 95 toward the first diffuser 15.

In this instance, the light emission portions 14b of the light sources 14 protrude from the bottom of the support 11, constituting the chassis, on the inside of the support 11. The white reflective sheet 95 covers the entire inner surface of the support 11 constituting the chassis (the inner bottom thereof and the inclined portion extending from the inner bottom) excluding the though-holes 11a serving as the insertion holes.

In this embodiment, the light source units 12, in each of which the light sources 14 are aligned on the circuit substrate 13, are arranged at regular intervals in a predetermined direction in parallel to each other in the support 11 constituting the chassis as shown in FIG. 9A. Thus, the light sources 14 are disposed in an array.

Figure 10:
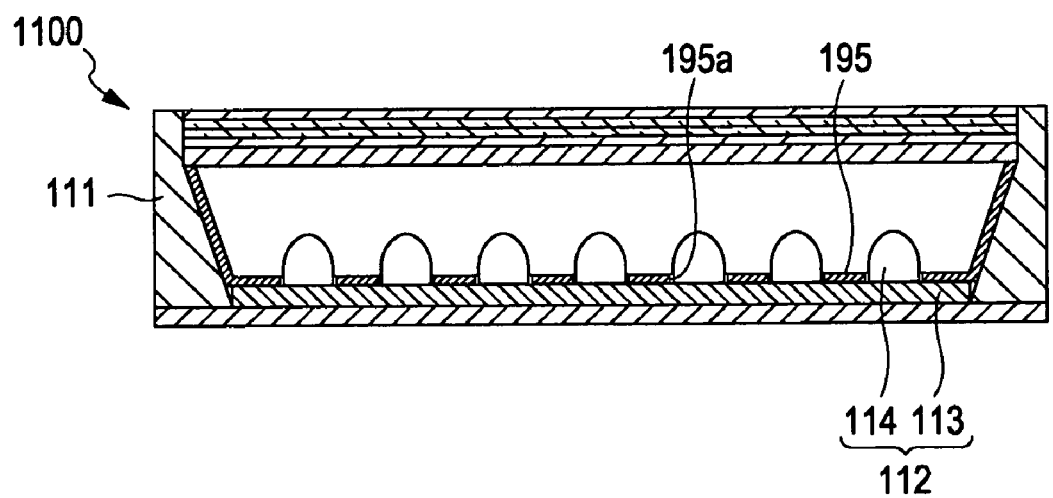
FIG. 10 is a diagram illustrating the structure of a typical backlight.

FIG. 10 is a cross-sectional view of the structure of a direct-lighting type backlight as a typical illumination system 1100.

Each light source unit 112 has a structure in which each light source 114 is mounted on a circuit substrate 113 such that terminals of the light source 114 are soldered to LED terminals (not shown) disposed on the front surface of the circuit substrate 113 (the upper surface thereof in FIG. 10).

As shown in FIG. 10, the illumination system 1100 has the following structure: The light source units 112 are arranged on the inner bottom of a support 111 constituting a chassis made of resin or metal. Accordingly, the light source units 112 are disposed inside the chassis 111.

A white reflective sheet 195 has a plurality of through-holes 195a, serving as insertion holes, in positions corresponding to the light sources 114. The light sources 114 are inserted into the through-holes 195a, so that the white reflective sheet 195 is bonded to the surfaces of the circuit substrates 113.

When the luminance of the light sources is increased, the amount of heat generated from the light sources is increased. Accordingly, a temperature in the chassis also rises. As a result, the light emission efficiency of the light sources decreases.

In particular, in a case where the light sources include LEDs, the number of necessary light sources is increased in order to increase the luminance, leading to an increased amount of heat generated. In consideration of the amount of heat generated and the resistance of a material for each LED to heat, it is necessary to devise a mechanism for cooling the LEDs and restrict the amount of current flowing into the LEDs. In addition, disadvantageously, it is difficult to reduce the size and thickness of such a direct-lighting type backlight.

Since the circuit substrates 113 are located between the inner bottom of the support 111 constituting the chassis and a diffuser 15, the inner bottom of the support 111 includes portions in each of which the circuit substrate 113 is placed and portions in each of which the circuit substrate 113 is not placed. Accordingly, the surface of the white reflective sheet 195 bonded or fixed to the circuit substrates 113 and the inner bottom of the support 111 may be bent or warped. It is therefore difficult to obtain uniform luminance.

In the fifth embodiment, however, heat generated from the light sources can be dissipated with high efficiency and each light source unit can be reduced in thickness.

Specifically, each light source 14 is inserted from the rear surface of the corresponding circuit substrate 13, so that the terminals 14c and 14d of the light source 14 are exposed at the rear surface of the circuit substrate 13. For example, if the light source units are arranged inside the support constituting the chassis, the terminals 14c and 14d of each light source 14 can be come into contact with the support 11. Since the support 11 is usually cooled by outside air, the terminals 14c and 14d are come into direct contact with the support 11, so that the effect of dissipating heat generated from the light sources 14 can be obtained.

In addition, when each circuit substrate 13 is located outside the support 11, constituting the chassis, as shown in FIG. 9B, the terminals 14c and 14d of each light source 14 are in direct contact with outside air. The effect of dissipating heat generated from the light sources 14 can be further increased.

Furthermore, each light source unit 12 can be reduced in thickness. In this instance, as shown in FIG. 9B, when each circuit substrate 13 is located outside the support 11 (on the opposite side of the support 11 from the inner bottom facing the diffuser), the illumination system 51 can be further reduced in thickness. In addition, the white reflective sheet 95 can be flattened on the inner bottom of the support 11 facing the diffuser. Advantageously, the uniformity of luminance can be ensured.

Although the embodiments have been described with respect to the case where the illumination system according to any of the embodiments is used as the backlight in the liquid crystal display device, the invention is applicable to a side light or a front light.

Exemplary Structure of Driving Circuit of Liquid Crystal Display Device

An exemplary structure of a driving circuit of a liquid crystal display device 1000 according to an embodiment will be described below with reference to FIG. 11. The liquid crystal display device 1000 includes an illumination system (hereinafter, "illumination system 90") that is any of the illumination systems according to the above-described first to fifth embodiments and those according to the above-described modifications.

Figure 11:
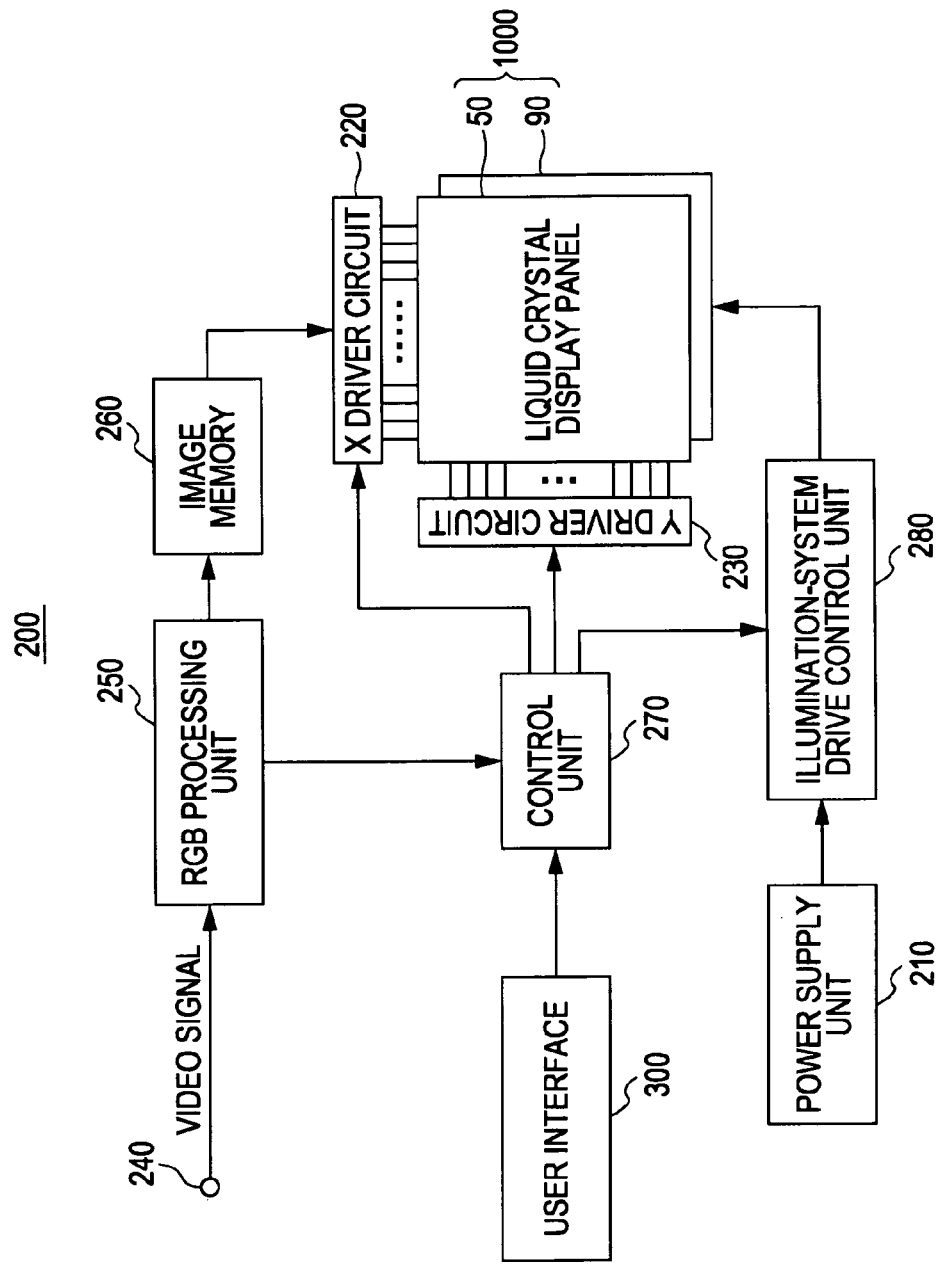
FIG. 11 is a block diagram illustrating an exemplary structure of a driving circuit of a liquid crystal display device according to an embodiment of the invention.

The liquid crystal display device 1000 is driven by a driving circuit 200 as shown in, for example, FIG. 11. The driving circuit 200 includes a power supply unit 210, an X driver circuit 220, a Y driver circuit 230, an RGB processing unit 250, an image memory 260, a control unit 270, and an illumination-system drive control unit 280. The power supply unit 210 supplies driving power to a liquid crystal display panel 50 and the illumination system 90. The X driver circuit 220 drives signal lines of the liquid crystal display panel 50. The Y driver circuit 230 drives scanning lines of the liquid crystal display panel 50. The RGB processing unit 250 receives video signals through an input terminal 240, the video signals including an externally supplied video signal and a video signal received through a receiving unit (not illustrated) in the liquid crystal display device 1000 and processed by a video signal processing unit (not shown) in the device. The RGB processing unit 250 is connected to the image memory 260 and the control unit 270. The illumination-system drive control unit 280 controls the illumination system 90. The liquid crystal display device 1000 is driven by organic functions of these components.

In the driving circuit 200, a video signal supplied through the input terminal 240 is subjected to signal processing, e.g., chroma processing, by the RGB processing unit 250. The resultant signal is further converted from a composite signal into RGB separate signals suitable for driving the liquid crystal display panel 50. The signals are supplied to the control unit 270 and are also supplied through the image memory 260 to the X driver circuit 220.

The control unit 270 controls the X driver circuit 220 and the Y driver circuit 230 at predetermined timing according to the RGB separate signals and drives the liquid crystal display panel 50 in accordance with the RGB separate signals supplied to the X driver circuit 220 through the image memory 260, thus allowing the liquid crystal display panel 50 to display an image based on the RGB separate signals.

The illumination-system drive control unit 280 generates a pulse width modulation (PWM) signal from a voltage supplied from the power supply unit 210 to drive the light sources 14 in the illumination system 90.

A user interface 300 is an interface for selecting a channel to be received by the receiving unit (not shown), adjusting the volume of an output of an audio output unit (not illustrated), controlling the luminance of white light from the illumination system 90 illuminating the liquid crystal display panel 50, and performing white balance control.

For example, when a user controls the luminance through the user interface 300, a luminance control signal is transmitted through the control unit 270 to the illumination-system drive control unit 280 in the driving circuit 200. Assuming that the light source units each include light sources of three colors of red (R), green (G), and blue (B), the illumination-system drive control unit 280 changes the duty ratio of a pulse width modulation signal for each color light source in accordance with the luminance control signal, thus driving the light sources of the respective colors.

With this structure, the illumination system 90 may include the power supply unit 210 and the illumination-system drive control unit 280. Alternatively, the illumination system 90 may further include a power supply that directly supplies power to the illumination system 90.

Electronic Apparatuses

Concrete examples of an electronic apparatus including the above-described liquid crystal display device 1000 will now be described with reference to FIGS. 12A and 12B.

An application of the liquid crystal display device 1000 according to the above-described embodiment to a display unit of a portable personal computer (so-called notebook personal computer) will be described below. FIG. 12A is a perspective view of the structure of the personal computer. Referring to FIG. 12A, the personal computer, indicated at 710, includes a main body 712 including a keyboard 711 and the display unit, indicated at 713, to which the liquid crystal display device 1000 according to the embodiment is applied.

An application of the liquid crystal display device 1000 according to the embodiment to a display unit of a mobile phone will be described below. FIG. 12B is a perspective view of the structure of the mobile phone. Referring to FIG. 12B, the mobile phone, indicated at 720, includes a plurality of operation buttons 721, an earpiece 722, a mouthpiece 723, and the display unit, indicated at 724, to which the liquid crystal display device 1000 according to the embodiment is applied.

Figure 12A:
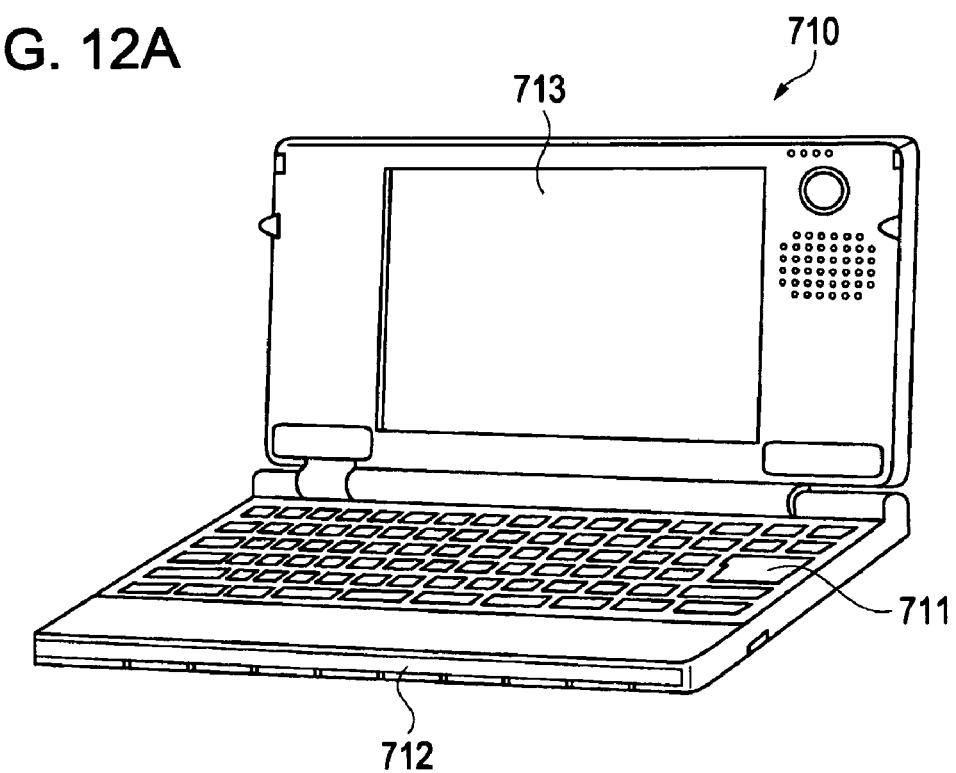
FIGS. 12A and 12B are perspective views of electronic apparatuses each including the liquid crystal display device according to the embodiment, the liquid crystal display device including the illumination system according to any of the embodiments and modifications.
Figure 12B:
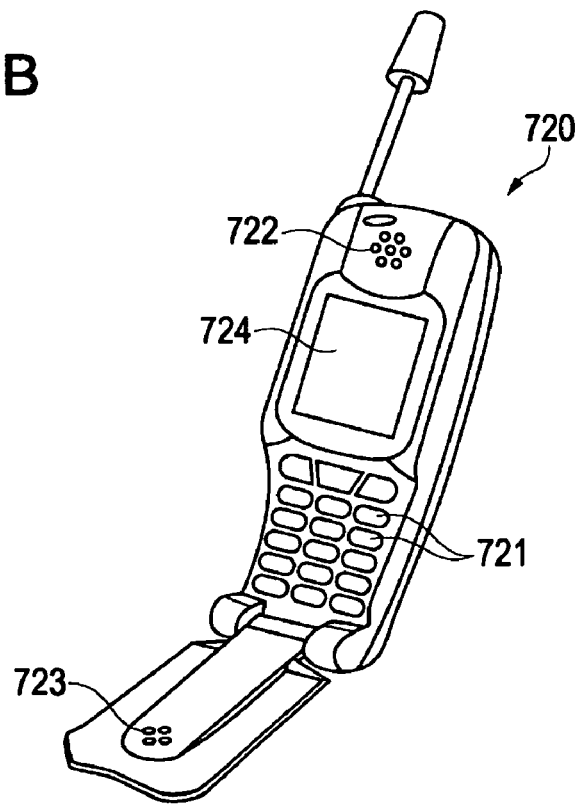

In addition to the personal computer in FIG. 12A and the mobile phone in FIG. 12B, examples of the electronic apparatus, to which the liquid crystal display device 1000 according to the embodiment is applicable, include a liquid crystal television, view-finder type and monitor-direct-view type video tape recorders, a car navigation system, a pager, an electronic organizer, an electronic calculator, a word processor, a workstation, a video phone, a POS terminal, and a digital still camera.

The entire disclosure of Japanese Patent Application Nos. 2008-114908, filed Apr. 25, 2008 and 2008-148922, filed Jun. 6, 2008 are expressly incorporated by reference herein.

What is claimed is:

1. An illumination system, comprising:
a light source unit including a light source and a circuit substrate electrically connected to the light source, wherein
the light source includes a base portion of insulating material, a light emission portion supported by the base portion, and terminals electrically connected to the light emission portion and formed on the base portion; and
the light source is placed in the circuit substrate such that an entirety of the light source, including the base portion, the light emission portion and the terminals, is covered by the circuit substrate in a thickness direction of the circuit substrate, or is located inside the circuit substrate.

2. The system according to claim 1, wherein
the light emission portion is exposed to one of opposite surfaces of the circuit substrate for emitting light from said one surface, and
the light source is entirely located inside the circuit substrate.

3. The system according to claim 2, wherein
the circuit substrate has a through-hole extending from said one surface to the other surface of the circuit substrate, and
the entirety of the light source is received in the through-hole.

4. The system according to claim 3, wherein
a bottom of the base portion of the light source opposite to the light emission portion is exposed, via the through-hole, to the other surface of the circuit substrate.

5. The system according to claim 2, further comprising:
a reflective member placed on said one surface of the circuit substrate, from which the light source emits light, wherein the reflective member does not overlap the light emission portion of the light source.

6. The system according to claim 1, wherein
the circuit substrate has a recess, and
the entirety of the light source is received in the recess.

7. The system according to claim 1, further comprising:
a heat dissipating member having a heat dissipation property and in contact with the base portion of the light source.

8. The system according to claim 1, further comprising:
a chassis holding the light source unit, wherein
the chassis has a through hole corresponding to the position of the light source.

9. An electro-optic device, comprising:
an electro-optic panel including two substrates and an electro-optic layer interposed between the substrates; and
the illumination system according to claim 1 placed on one surface of the electro-optic panel.

10. An electronic apparatus, comprising a display unit including the electro-optic device according to claim 9.

11. An illumination system, comprising:
a plurality of light sources, and
a circuit substrate electrically connected to the light sources,
wherein
the circuit substrate includes opposite surfaces, and a plurality of recesses formed in one of said surfaces;
each of the light sources includes a base portion of insulating material, a light emission portion supported by the base portion, and terminals electrically connected to the light emission portion and formed on the base portion;
an entirety of each said light source, including the base portion, the light emission portion, and the terminals, is located inside a respective one of said recesses to be completely covered by the circuit substrate in a thickness direction of the circuit substrate, and
each said recess has an opening on said surface, said opening being uncovered to permit light emitted by the respective light source to radiate outside.

12. The system according to claim 11, wherein
each said light source has the respective light emission portion exposed through the opening of the respective recess for emitting light from said one surface of the circuit substrate.

13. The system according to claim 12, wherein
the light emission portion is completely recessed below said surface of the circuit substrate.

14. The system according to claim 12, wherein
the circuit substrate further has a plurality of through-holes each extending from said one surface to the other surface of the circuit substrate,
each said recess is a first part of one of the through holes,
each said through hole further has a second part connecting the respective recess to the other surface of the circuit substrate.

15. The system according to claim 14, wherein
the second part of each said through hole is smaller in cross-section than the respective recess.

16. The system according to claim 14, wherein
each said light source has the respective base portion opposite the light emission portion, said base portion being exposed to the second part of the respective through hole at a bottom of the respective recess, and
said system further comprises a heat dissipating member having a heat dissipation property and positioned in the second part of each said through hole to be in contact with the respective light source via the base portion thereof.

17. The system according to claim 12, further comprising:
a reflective member placed on said one surface of the circuit substrate, from which the light sources emit light, wherein the reflective member does not overlap the light sources.

18. An electro-optic device, comprising:
a liquid crystal display (LCD) panel including two substrates and a liquid crystal layer interposed between the substrates; and
the illumination system according to claim 11 placed on one surface of the LCD panel to provide backlight for the liquid crystal layer.

19. An illumination system, comprising:
a plurality of light sources, and
a circuit substrate electrically connected to the light sources,
wherein
the circuit substrate includes opposite surfaces, and a plurality of recesses formed in one of said surfaces;
an entirety of each said light source is located inside a respective one of said recesses to be completely covered by the circuit substrate in a thickness direction of the circuit substrate;
each said recess has an opening on said surface, said opening being uncovered to permit light emitted by the respective light source to radiate outside;
each said light source has a light emission portion exposed through the opening of the respective recess for emitting light from said one surface of the circuit substrate;
the circuit substrate further has a plurality of through-holes each extending from said one surface to the other surface of the circuit substrate;
each said recess is a first part of one of the through holes;
each said through hole further has a second part connecting the respective recess to the other surface of the circuit substrate;
each said light source has a base portion opposite the light emission portion, said base portion being exposed to the second part of the respective through hole at a bottom of the respective recess;
said system further comprises a heat dissipating member having a heat dissipation property and positioned in the second part of each said through hole to be in contact with the respective light source via the base portion thereof; and
the heat dissipating member further includes a portion outside the through holes and covering the other surface of the circuit substrate.

20. An illumination system, comprising:
a plurality of light sources, and
a circuit substrate electrically connected to the light sources,
wherein
the circuit substrate includes opposite surfaces, and a plurality of recesses formed in one of said surfaces;
an entirety of each said light source is located inside a respective one of said recesses to be completely covered by the circuit substrate in a thickness direction of the circuit substrate;
each said recess has an opening on said surface, said opening being uncovered to permit light emitted by the respective light source to radiate outside;
each said light source has a light emission portion exposed through the opening of the respective recess for emitting light from said one surface of the circuit substrate;
the circuit substrate further has a plurality of through-holes each extending from said one surface to the other surface of the circuit substrate;
each said recess is a first part of one of the through holes;
each said through hole further has a second part connecting the respective recess to the other surface of the circuit substrate;
each said light source has a base portion opposite the light emission portion, said base portion being exposed to the second part of the respective through hole at a bottom of the respective recess;
said system further comprises a heat dissipating member having a heat dissipation property and positioned in the second part of each said through hole to be in contact with the respective light source via the base portion thereof;

the circuit substrate includes, at the bottom of each recess, terminals for electrical connection to the respective light source;

each said light source has on the base portion thereof further terminals which electrically connect the respective light emission portion to the terminals on the bottom of the respective recess; and the heat dissipating member in the second part of each said through hole extends between the terminals of the respective recess and light source to come into contact with the base portion of the respective light source.

* * * * *